United States Patent
Wu et al.

(10) Patent No.: US 11,054,746 B2
(45) Date of Patent: Jul. 6, 2021

(54) PORTION OF LAYER REMOVAL AT SUBSTRATE EDGE

(71) Applicant: Applied Materials, Inc., Santa Clara, CA (US)

(72) Inventors: Banqiu Wu, San Jose, CA (US); Eli Dagan, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 210 days.

(21) Appl. No.: 16/557,466

(22) Filed: Aug. 30, 2019

(65) Prior Publication Data

US 2020/0096860 A1  Mar. 26, 2020

Related U.S. Application Data

(60) Provisional application No. 62/734,631, filed on Sep. 21, 2018.

(51) Int. Cl.
| | | |
|---|---|---|
| *G03F 7/20* | (2006.01) | |
| *G03F 1/76* | (2012.01) | |
| *G03F 1/78* | (2012.01) | |
| *G03F 1/80* | (2012.01) | |

(52) U.S. Cl.
CPC .............. *G03F 7/2028* (2013.01); *G03F 1/76* (2013.01); *G03F 1/78* (2013.01); *G03F 1/80* (2013.01); *G03F 7/2053* (2013.01); *G03F 7/2059* (2013.01); *G03F 7/2063* (2013.01); *G03F 7/70733* (2013.01)

(58) Field of Classification Search
CPC ..... G03F 1/76; G03F 1/78; G03F 1/80; G03F 7/2028; G03F 7/2053; G03F 7/2059; G03F 7/2063; G03F 7/70733
USPC ...................................... 430/5, 296, 328, 942
See application file for complete search history.

(56) References Cited

U.S. PATENT DOCUMENTS

| | | |
|---|---|---|
| 6,495,312 B1 | 12/2002 | Young et al. |
| 9,325,228 B2 | 4/2016 | Hudgens et al. |
| 2005/0020087 A1 | 1/2005 | Wagner et al. |
| 2011/0168672 A1 | 7/2011 | Harte et al. |
| 2016/0240419 A1 | 8/2016 | Sieber et al. |

FOREIGN PATENT DOCUMENTS

| | | |
|---|---|---|
| KR | 20060012081 A | 2/2006 |
| TW | 201823295 A | 7/2018 |

OTHER PUBLICATIONS

Taiwan Office Action for Application No. TW 108130755 dated Sep. 10, 2020.
International Search Report and Written Opinion dated Dec. 3, 2019 for Application No. PCT/US2019/047574.
Edge Bead Removal, Article, 2009, Board of Regents of the University of California, 1 page, accessed by web Aug. 22, 2018, https://www.nanotech.ucsb.edu/index.php/nanofabrication-facility?id=164.

*Primary Examiner* — Christopher G Young
(74) *Attorney, Agent, or Firm* — Patterson + Sheridan, LLP

(57) ABSTRACT

Generally, examples described herein relate to systems and methods for processing a substrate, and more particularly, for removing an edge bead or other source of contamination from an edge of a substrate. An example is a processing system including a chamber, a substrate handler within the chamber, and a radiation generator within the chamber. The substrate handler is configured to secure a substrate. The substrate handler is operable to position an edge surface of the substrate such that radiation propagating from the radiation generator is directed to the edge surface of the substrate, and operable to position a periphery region of a deposit surface of the substrate that is perpendicular to and along the edge surface such that radiation propagating from the radiation generator is directed to the periphery region.

20 Claims, 10 Drawing Sheets

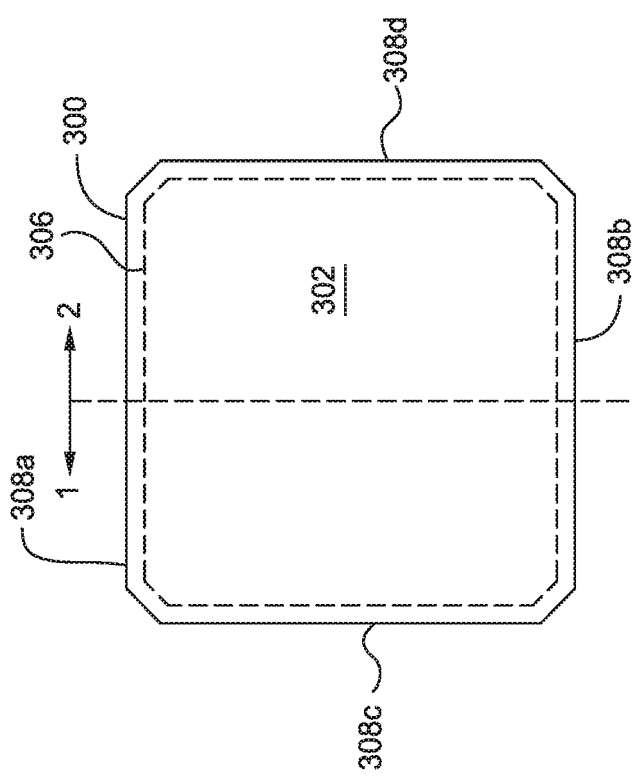
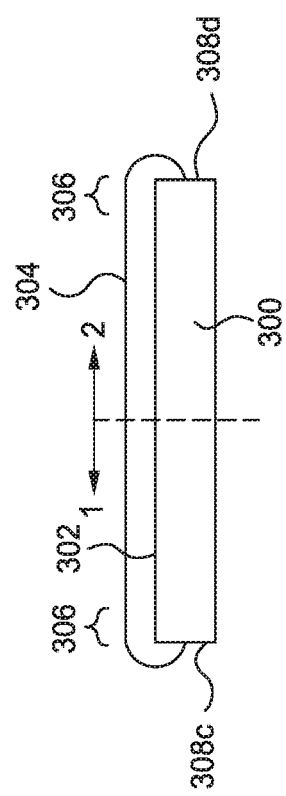

PORTION OF LAYER REMOVAL AT SUBSTRATE EDGE

CROSS-REFERENCE TO RELATED APPLICATIONS

This application claims priority to and the benefit of U.S. Provisional Patent Application Ser. No. 62/734,631, filed on Sep. 21, 2018, and entitled "PORTION OF LAYER REMOVAL AT SUBSTRATE EDGE," which is incorporated herein by reference in its entirety herein.

BACKGROUND

Field

Examples described herein generally relate to systems and methods for processing a substrate, and more particularly, to removing an edge bead or other portion of a layer at an edge of a substrate.

Description of the Related Art

Reliably producing semiconductor devices depends on uniformity of processes across different substrates (e.g., wafer) and across each individual substrate. Some processing is known to create non-uniformities on a substrate. More specifically, some deposition processes can cause a build-up of a deposited layer at an edge of the substrate, which is commonly referred to as an edge bead. This non-uniformity can adversely affect subsequent processing, which in turn can adversely affect the ability to reliably produce semiconductor devices.

SUMMARY OF THE DISCLOSURE

An example is a processing system. The processing system includes a chamber, a substrate handler, and a radiation generator. The substrate handler is within the chamber. The substrate handler is configured to secure a substrate. The radiation generator is within the chamber. The substrate handler is further operable to position an edge surface of the substrate such that radiation propagating from the radiation generator is directed to the edge surface of the substrate, and operable to position a periphery region of a deposit surface of the substrate that is perpendicular to and along the edge surface such that radiation propagating from the radiation generator is directed to the periphery region of the deposit surface.

An example is a method of processing a substrate. A periphery region of a deposit surface of the substrate is positioned, in a first orientation, relative to a radiation generator to have radiation from the radiation generator be directed to the periphery region. The deposit surface has a layer deposited thereon. Radiation is directed from the radiation generator to the periphery region while the periphery region is in the first orientation. An edge surface of the substrate is positioned, in a second orientation, relative to the radiation generator to have radiation from the radiation generator be directed to the edge surface. The edge surface is perpendicular to the deposit surface. Radiation is directed from the radiation generator to the edge surface while the edge surface is in the second orientation.

A yet further example is a method of processing a substrate. A photoresist is deposited on a working layer on a rectangular substrate. The photoresist is patterned. Portions of the photoresist on perpendicular surfaces at an edge of the rectangular substrate are exposed to radiation. After exposing the portions of the photoresist to radiation, the working layer is etched, including using the patterned photoresist as a mask.

BRIEF DESCRIPTION OF THE DRAWINGS

So that the manner in which the above recited features of the present disclosure can be understood in detail, a more particular description, briefly summarized above, may be had by reference to examples, some of which are illustrated in the appended drawings. It is to be noted, however, that the appended drawings illustrate only some example and are therefore not to be considered limiting of its scope, for the disclosure may admit to other equally effective examples.

FIGS. 3A and 3B are a top view and cross-sectional view, respectively, of a substrate to illustrate some examples of the present disclosure.

To facilitate understanding, identical reference numerals have been used, wherever possible, to designate identical elements that are common to the figures.

DETAILED DESCRIPTION

Generally, examples described herein relate to systems and methods for processing a substrate. Substrates can have various layers deposited on them, which may be subsequently etched to form structures or removed after serving some purpose, such as a mask. Some layers may not be uniformly deposited, particularly at edges of the substrates. A build-up of a layer at an edge of a substrate can create an edge bead. Removal of edge beads has been attempted by using wet processes. However, such wet processes can cause adverse effects in subsequent processing. For example, when processing a photomask, a wet process used to remove an edge bead can cause contamination of a backside of the photomask, which can adversely affect the utility of the photomask for patterning photoresists. Examples described herein provide for systems and methods for removing an edge bead or other source of contamination from an edge of a substrate using dry processing. Such processing can reduce contamination on a substrate, can be environmentally benign, can be easy to use, and can be low cost.

Examples described herein can have broad applicability to various substrates and to various layers. Some examples described herein are in the context of a photoresist deposited on a rectangular substrate (e.g., a square substrate) for processing of a photomask. Other examples contemplate use for any layer, e.g., any metal layer, dielectric layer, photoresist, etc., that may have portions at edges of a substrate that are to be removed. For example, in the context of a photomask, examples can remove portions of an absorber layer, a multiple layer structure, a backside layer, etc. Further, other examples contemplate use of any substrate geometry, such as a circular substrate (e.g., wafer), rectangular substrate (e.g., square substrate), etc. A person having ordinary skill in the art will readily understand various modifications to examples described herein that may be made to accommodate different layers and/or different substrates.

As specifically contemplated, examples can be implemented in the context of processing a photomask. Examples can be implemented for a binary intensity mask (BIM), a phase shift mask (PSM) (including an embedded attenuated PSM (EAPSM) and alternating aperture PSM (AAPSM)), and an extreme ultraviolet (EUV) mask.

Various different examples are described below. Although multiple features of different examples may be described together in a process flow or system, the multiple features can each be implemented separately or individually and/or in a different process flow or different system. Additionally, various process flows are described as being performed in an order; other examples can implement process flows in different orders and/or with more or fewer operations.

Figure 1:
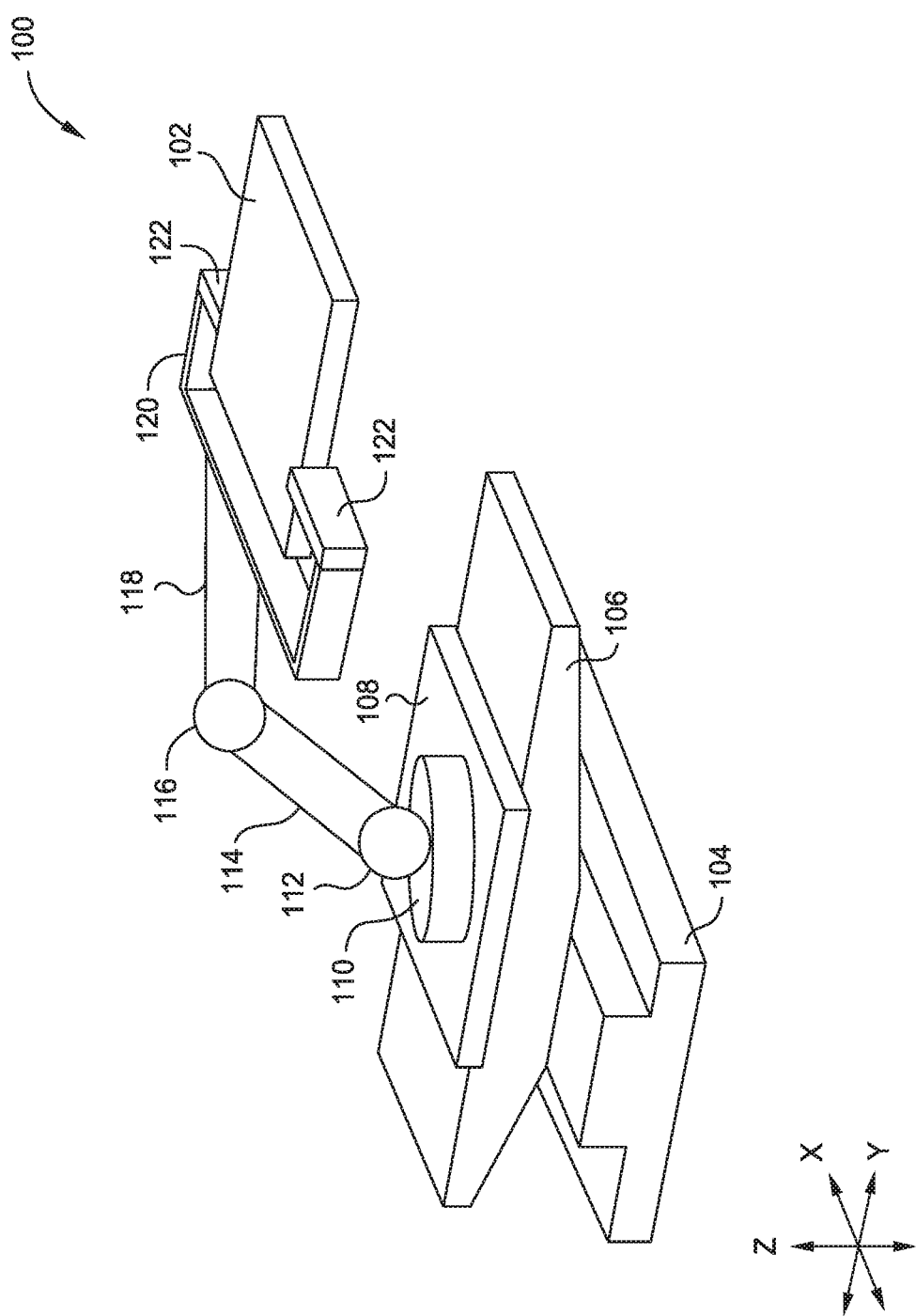
FIG. 1 is an example substrate handler according to some examples of the present disclosure.

FIG. 1 illustrates an example substrate handler 100 according to some examples of the present disclosure. The substrate handler 100 is generally operable to secure a substrate, such as for a photomask, and move the substrate in x, y, and/or z translations and in pitch, yaw, and/or roll rotations. FIG. 1 illustrates the substrate handler 100 securing a photomask substrate 102 for reference.

The substrate handler 100 includes a base 104, a first moveable stage 106, a second moveable stage 108, and a rotatable stage 110. The base 104 can be attached or fixed in a chamber of a processing system, for example. The base 104 supports the first moveable stage 106, and the first moveable stage 106 is operable to move along and relative to the base 104. The first moveable stage 106 is moveable along the x-direction (as illustrated by the reference XYZ axes illustrated in FIG. 1). The base 104 and/or the first moveable stage 106 can include a rail and guide (e.g. magnetic rail and guide) that couple the first moveable stage 106 to the base 104 and that permit the first moveable stage 106 to move relative to the base 104. Any other mechanism that permits movement of the first moveable stage 106 relative to the base 104 may be used, such as screw actuators and/or the like.

The first moveable stage 106 supports the second moveable stage 108, and the second moveable stage 108 is operable to move along and relative to the first moveable stage 106. The second moveable stage 108 is operable to move along a direction (relative to the first moveable stage 106) that is perpendicular to the direction along which the first moveable stage 106 is operable to move (relative to the base 104). The second moveable stage 108 is moveable along the y-direction (as illustrated by the reference XYZ axes illustrated in FIG. 1). The first moveable stage 106 and/or the second moveable stage 108 can include a rail and guide (e.g. magnetic rail and guide) that couple the second moveable stage 108 to the first moveable stage 106 and that permit the second moveable stage 108 to move relative to the first moveable stage 106. Any other mechanism that permits movement of the second moveable stage 108 relative to the first moveable stage 106 may be used, such as screw actuators and/or the like.

The second moveable stage 108 supports the rotatable stage 110, and the rotatable stage 110 is operable to rotate around an axis perpendicular to the parallel planes in which the first moveable stage 106 and second moveable stage 108 are operable to move. As described above, the first moveable stage 106 is moveable along an x-direction, and the second moveable stage 108 is moveable along a y-direction. Hence, the first moveable stage 106 and second moveable stage 108 are moveable to translate in respective x-y planes. The rotatable stage 110 is operable to move in rotation around the z-axis (as illustrated by the reference XYZ axes illustrated in FIG. 1), which is perpendicular to the x-y planes in which the first moveable stage 106 and second moveable stage are operable to move. The rotatable stage 110 is moveable by a motor or other actuator.

The substrate handler 100 further includes a robot arm supported by the rotatable stage 110. The robot arm includes links, rotatable joints, a wrist, and a holder. A first rotatable joint 112 is supported by and coupled to the rotatable stage 110. A first link 114 is coupled to the first rotatable joint 112 at a first end of the first link 114. A second rotatable joint 116 is coupled to the first link 114 at a second end (opposite from the first end) of the first link 114. A second link 118 is coupled to the second rotatable joint 116 at a first end of the second link 118. A wrist (not specifically identified) is coupled to the second link 118 at a second end (opposite from the first end) of the second link 118. A substrate holder 120 is coupled to the wrist.

Each of the first rotatable joint 112 and second rotatable joint 116 are rotatable in at least one direction, which may be around an axis perpendicular to a plane in which the first link 114 extends. For example, as illustrated in FIG. 1, the first rotatable joint 112 and second rotatable joint 116 can be rotatable around respective axes that are in an x-y plane, which axes can be parallel. The wrist can be rotatable in two directions. The wrist can be rotatable around an axis that is parallel to the axes of rotation of the first rotatable joint 112 and the second rotatable joint 116. Further, the wrist can be rotatable around an axis that is perpendicular to the parallel axes of rotation of the first rotatable joint 112 and the second rotatable joint 116. As an example, assuming a proper orientation, the wrist can be rotatable around an axis parallel to the x-axis and around an axis parallel to the y-axis. The first rotatable joint 112, second rotatable joint 116, and wrist can be moveable by a motor or other actuator, for example. The various joints and wrist can be rotatable around any axis to achieve movement of a substrate, such as described herein.

The substrate holder 120 can be or include a clamp. The substrate holder 120 includes jaws 122. One or both of the jaws 122 can be moveable to clamp onto and secure the photomask substrate 102. The jaws 122 can be moveable by an actuator or other mechanism. In other examples, the substrate holder 120 can be or include an electrostatic chuck. In other examples, the substrate holder 120 can be or include a support plate with holes therethrough, where the holes are fluidly coupled to a vacuum system such that suction can be applied to a substrate disposed on the support plate to secure the substrate. In further examples, the substrate holder 120 can be another mechanism.

The substrate handler 100 is capable of securing the photomask substrate 102 and moving the photomask substrate 102, including by translation and rotation. Depending on the range of motion, proximity of other components, and/or orientation of the other components, some moveable components of the substrate handler 100 illustrated in and described with respect to FIG. 1 may be omitted, and/or additional moveable components may be included in the substrate handler 100.

Figure 2:
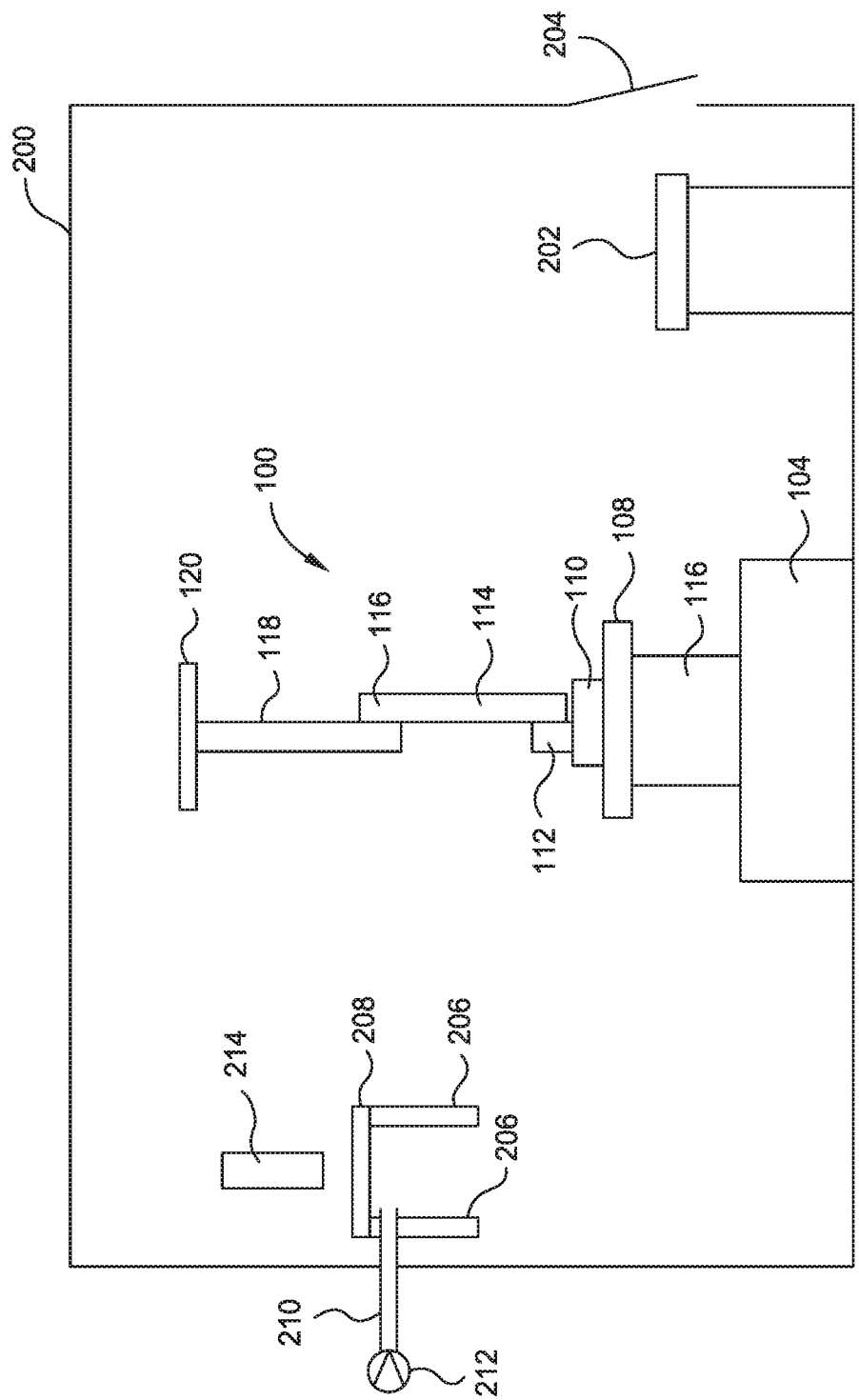
FIG. 2 is an example chamber of a processing system according to some examples of the present disclosure.

FIG. 2 illustrates a simplified, example chamber 200 of a processing system according to some examples of the present disclosure. The chamber 200 includes the substrate handler 100 of FIG. 1. The chamber 200 has an interior space defined by sidewalls, a ceiling, and a floor. The substrate handler 100 is disposed within the interior space of the chamber 200. The interior space may or may not be sealed from an ambient environment exterior to the chamber 200. If the interior space is sealed from the ambient environment, the interior space may be operated in a low or high pressure state (relative to the ambient environment) and/or may have an environment of inert gas therein. In some examples, the interior space is not sealed from the ambient environment, which may permit, e.g., air from a fabrication facility to be in and flow into or out of the interior space.

A substrate stage 202 is disposed in the interior space of the chamber 200 and proximate a chamber door 204 in a sidewall of the chamber 200. The substrate stage 202 is positioned proximate the chamber door 204 to receive a substrate (e.g., photomask) from, for example, a transfer robot extending through the chamber door 204 from an adjoining chamber or load lock. In some examples, the substrate stage 202 is not moveable. In other examples, the substrate stage 202 may be operable to rotate around an axis perpendicular to a surface of the substrate stage 202 that receives a substrate. The substrate handler 100 is positioned and oriented in the interior space of the chamber 200 to receive and secure a substrate from the substrate stage 202 by the substrate holder 120.

An exposure apparatus is also disposed in the interior space of the chamber 200. The exposure apparatus includes an extractor housing that includes walls 206 and a transparent window 208. The walls 206 can include or be any material, such as ceramic, metal, or the like. The transparent window 208 can include or be quartz, fused silica, or another transparent material. An opening to an interior space of the extractor housing is defined by the walls 206 and is opposite from the transparent window 208. The interior space of the extractor housing is fluidly connected, e.g., via an outlet such as conduit 210, to a pump 212. The pump 212 is operable to pump out a gas from the interior space of the extractor housing.

The exposure apparatus further includes a radiation generator 214. The radiation generator 214 is operable to generate radiation, such as an ultraviolet (UV) laser, electron beam (e-beam), or any other radiation capable of removing a contamination source. The radiation generator 214 is positioned relative to the extractor housing to direct radiation (e.g., a UV laser or e-beam) generated by the radiation generator 214 through the transparent window 208 into the interior space of the extractor housing. In some examples, the radiation generator 214 is fixed such that the direction of propagation of radiation directed to the interior space of the extractor housing is fixed and does not move. In other examples, the radiation generator 214 may be moveable and/or the direction of the propagation of radiation may be alterable along a direction such that the radiation generated by the radiation generator 214 can move (e.g., scan) along a direction.

Generally, in operation, the substrate handler 100 receives a substrate from the substrate stage 202 and transports the substrate proximate to the extractor housing. The substrate has a photoresist material or other layer deposited thereon. The photoresist can be developed or undeveloped. The substrate handler 100 positions an edge of the substrate proximate to the opening of the extractor housing. The radiation generator 214 directs radiation (e.g., a UV laser or e-beam) through the transparent window 208 to any photoresist or other layer at the edge of the substrate. The pump 212 can extract or exhaust any byproducts, fumes, etc. that result from exposing the photoresist or layer to the radiation. The pump 212 can cause air or other gas to flow proximate to the edge of the substrate through the opening of the extractor housing and into the interior of the extractor housing, which can permit the pump 212 to extract or exhaust any byproducts, fumes, etc.

Some examples include the extractor housing and pump 212, such as when the chamber 200 is used to process substrates that have a developed photoresist or other layer thereon. In other examples, the extractor housing and pump 212 may be omitted, such as when the chamber 200 is used to process substrates that have an undeveloped photoresist thereon.

FIGS. 3A and 3B illustrate a top view and cross-sectional view, respectively, of a substrate 300 to illustrate various examples of the present disclosure. As shown in the top view of FIG. 3A, the substrate 300 is generally a rectangular shape (e.g., square substrate), which may include notches at corners. The substrate 300 has a deposit surface 302 (e.g., a top surface) on which a photoresist 304 is deposited. For clarity, the photoresist 304 is not explicitly illustrated in the top view of FIG. 3A. A periphery region 306 (identified between a dashed line and respective edge of the substrate 300) is along outer edges of the deposit surface 302. The substrate 300 has edge surfaces 308a, 308b, 308c, and 308d. Edge surfaces 308a and 308b are on opposite sides of the substrate 300, and edge surfaces 308c and 308d are on opposite sides of the substrate 300. The edge surfaces 308a, 308b, 308c, and 308d are perpendicular to the deposit surface 302. An imaginary dividing line 310 (shown in phantom) bisects the substrate 300 to facilitate description herein. For a component that crosses the line 310, a portion of that component on one side of the line may be referred to by a "-1" or "-2" appended to the reference number of the component. For example, edge surface 308a-1 refers to the portion of the edge surface 308a on the side of the line 310 indicated by the "1" in FIGS. 3A and 3B, and edge surface 308a-2 refers to the portion of the edge surface 308a on the side of the line 310 indicated by the "2" in FIGS. 3A and 3B.

As illustrated by FIG. 3B, the photoresist 304 is deposited on the deposit surface 302 of the substrate 300 and along portions of the edge surfaces 308a, 308b, 308c, 308d of the substrate 300 proximate the deposit surface 302. The photoresist 304 may be deposited on the edge surfaces 308a, 308b, 308c, 308d as a result of a spin coating process used to deposit the photoresist 304. If not removed, the photoresist 304 on the periphery region 306 and on the edge surfaces 308a, 308b, 308c, 308d can be a source of a contaminate that can have adverse effects during an etch process. Accordingly, some example processes and processing systems are directed to removal of photoresist along a periphery region and edge surfaces of a substrate.

Figure 4:
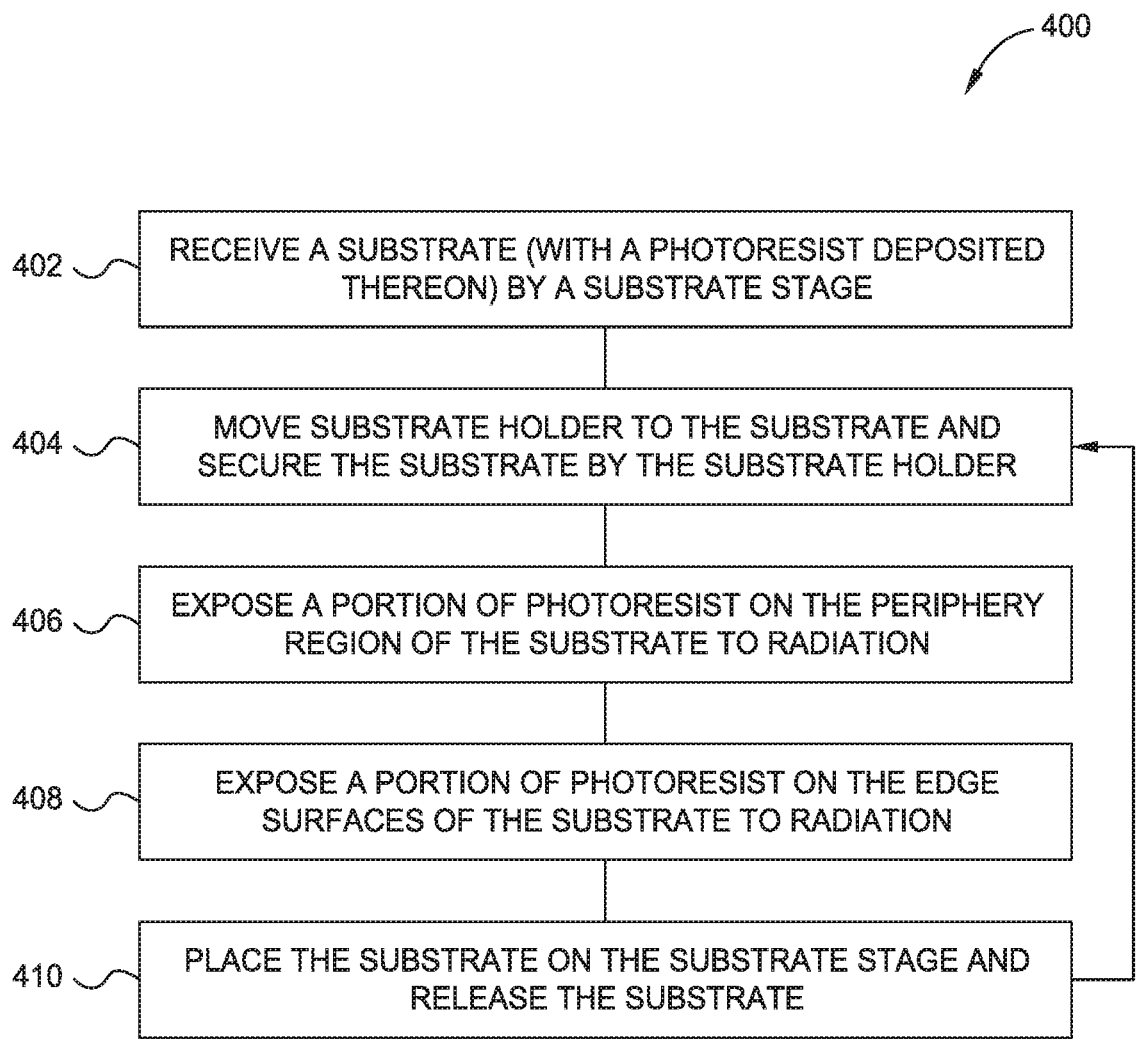
FIG. 4 is a method for removing portions of a photoresist from edges of a substrate according to some examples of the present disclosure.

FIG. 4 is a method 400 for removing portions of a photoresist from edges of a substrate according to some examples of the present disclosure. The method 400 will be described in the context of FIGS. 5 through 8 as an example.

Figure 5:
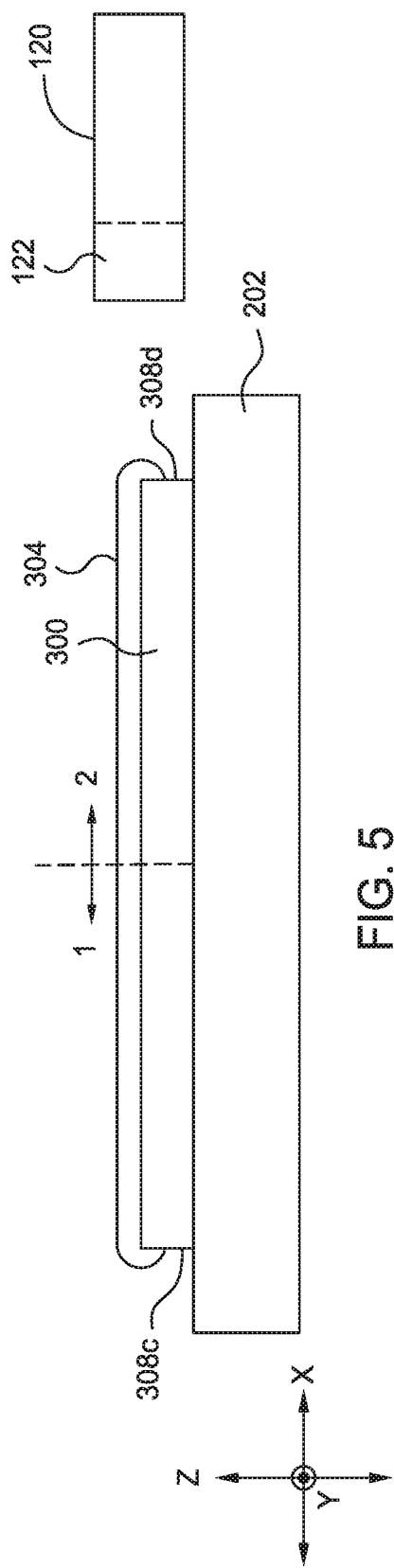
FIG. 5 is a cross sectional view of a substrate, having a photoresist thereon, supported by a substrate stage according to some examples of the present disclosure.

In operation 402, a substrate 300 (with a photoresist deposited thereon) is received by a substrate stage 202. As shown in FIG. 5, the substrate 300 is received and supported by the substrate stage 202. In operation 404, the substrate handler 100 moves the substrate holder 120 to the substrate 300 and secures the substrate 300 by the substrate holder 120. The substrate handler 100 can perform any movements to move the substrate holder 120 to the substrate 300, such as by any translation by the first moveable stage 106 and/or second moveable stage 108, and/or any rotation by the rotatable stage 110, first rotatable joint 112, second rotatable joint 116, and/or wrist. With the substrate holder 120 positioned at the substrate 300, the jaws 122 are actuated to provide opposing forces on the edge surfaces 308a-2 and 308b-2 of the substrate 300 to thereby secure the substrate 300. With the substrate 300 secured by the substrate holder 120, the substrate handler 100 can move the substrate 300 within the chamber 200, for example.

Figure 6:
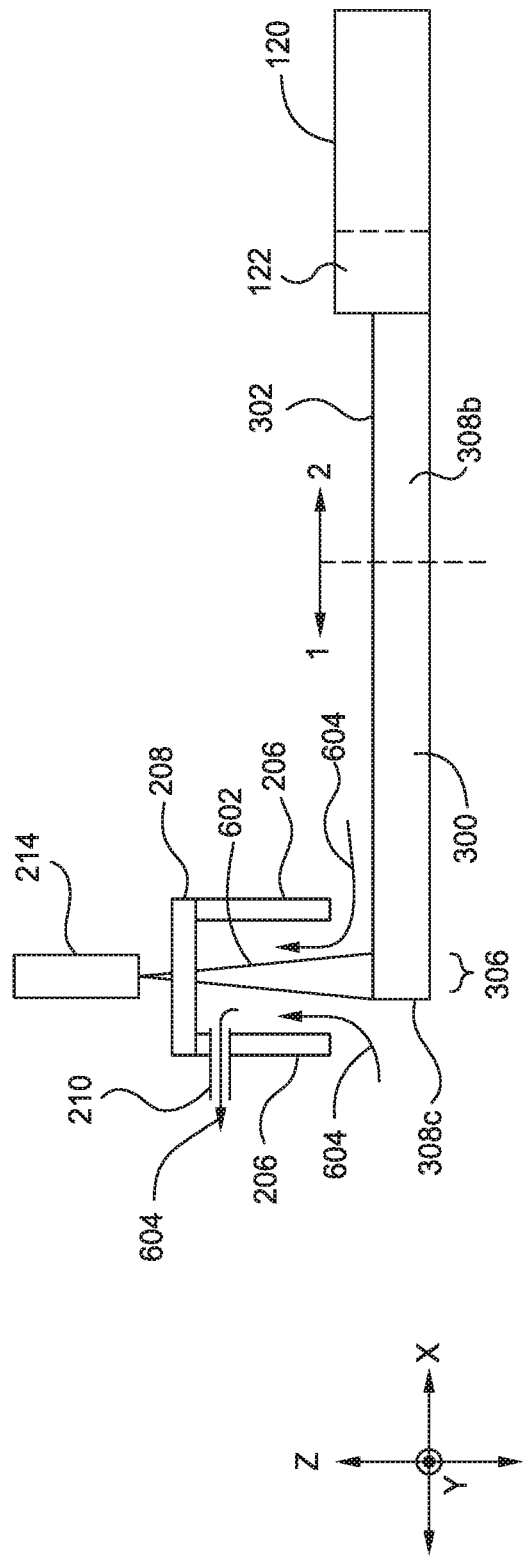
FIG. 6 is a schematic view of an orientation of a substrate during exposure of a photoresist on a periphery region of the substrate according to some examples of the present disclosure.

In operation 406, a portion of the photoresist 304 on the periphery region 306-1 of the deposit surface 302 of the substrate 300 is exposed to radiation from the radiation generator 214. Referring to FIG. 6, with the substrate holder 120 securing the substrate 300 via the edge surfaces 308a-2 and 308b-2, the substrate handler 100 orients the deposit surface 302 in a plane perpendicular to a direction of propagation of radiation generated by the radiation generator 214. The substrate handler 100 then positions and moves the substrate 300 such that the radiation 602 (e.g., a UV laser or e-beam) generated by and propagating from the radiation generator 214 is incident on the photoresist 304 on the periphery region 306-1 of the deposit surface 302 along the edge surfaces 308a-1, 308c, and 308b-1. The photoresist 304 is not explicitly illustrated in FIGS. 6 through 8 to avoid obscuring features illustrated in those figures; a person having ordinary skill in the art will readily understand the presence of the photoresist 304. In some examples, a UV laser is used, such as for a photomask. In such examples, a substrate for a photomask can be transparent, and the UV laser may not damage the substrate. In other examples, a UV laser may cause some damage to an opaque substrate.

In some examples, the direction of propagation of the radiation 602 is fixed. In such examples, the substrate handler 100 is operable to translate the substrate 300 in x and y-directions to scan the radiation 602 on the photoresist 304 on the periphery region 306-1 along the edge surfaces 308a-1, 308c, and 308b-1. For example, from an initial position where the radiation 602 is incident on the photoresist 304 on the periphery region 306-1, the first moveable stage 106 and second moveable stage 108 move in x and y-directions to thereby cause the substrate 300 to be translated in x and y-directions.

In some examples, the direction of propagation of the radiation 602 may be moveable along a direction. In such examples, the substrate handler 100 is operable to position the substrate 300 such that a portion of the periphery region 306-1 to be exposed is aligned with the direction of movement of the direction of propagation of the radiation 602. Then, with the substrate handler 100 and substrate 300 immobile, the radiation 602 scans along the direction to be incident on the photoresist 304 on the periphery region 306-1 along a respective one of the edge surfaces 308a-1, 308c, and 308b-1. The substrate handler 100 then repositions the substrate 300 to align another portion of the periphery region 306-1 with the direction of movement of the direction of propagation of the radiation 602, and while the substrate 300 is immobile, the radiation 602 scans along the direction. These operations can be repeated until the photoresist 304 on the periphery region 306-1 along the edge surfaces 308a-1, 308c, and 308b-1 is exposed to the radiation 602.

In further examples, the direction of propagation of the radiation 602 can be fixed while exposing some portions of the photoresist 304 on the periphery region 306-1 and can be moveable while exposing other portions of the photoresist 304 on the periphery region 306-1. Various features of the exposure operations can be combined to expose the photoresist 304 on the periphery region 306-1.

In some examples, the extractor housing is implemented to remove byproducts, fumes, etc. that result from the exposure. The photoresist 304, in some examples, is developed prior to the exposure. In such examples, the exposure ablates the developed photoresist 304, which results in byproducts, fumes, etc. The substrate 300 is positioned proximate to the opening of the extractor housing, which opening is defined by walls 206. The pump 212 is turned on to create a pressure differential that causes a flow 604 of gas (e.g., air or other gas in the interior space of the chamber 200) from proximate to the photoresist 304 on the periphery region 306-1 being exposed, into the interior of the extractor housing, and out of the extractor housing and chamber 200 via the conduit 210. This flow 604 can exhaust byproducts, fumes, etc. that may otherwise be a source of contamination on the substrate 300 if not removed. Further, with implementing the extractor housing, the radiation 602 propagates from the radiation generator 214 through the transparent window 208 and interior space of the extractor housing before being incident on the photoresist 304. In still other examples, an extractor can be implemented by a conduit (e.g., a pipe or hose) with an opening proximate to the substrate 300 when the substrate 300 is exposed. The conduit can create a flow of gas to exhaust byproducts, fumes, etc.

In other examples, the extractor housing can be omitted. The photoresist 304, in some examples, is a positive photoresist that is not developed prior to the exposure. The exposure of the photoresist 304 renders the exposed portion of the photoresist 304 soluble to a developer. Creation of byproducts and fumes can be reduced or avoided by such an exposure. The exposed portion of the photoresist 304 can be subsequently removed when the photoresist 304 is developed.

Figure 7:
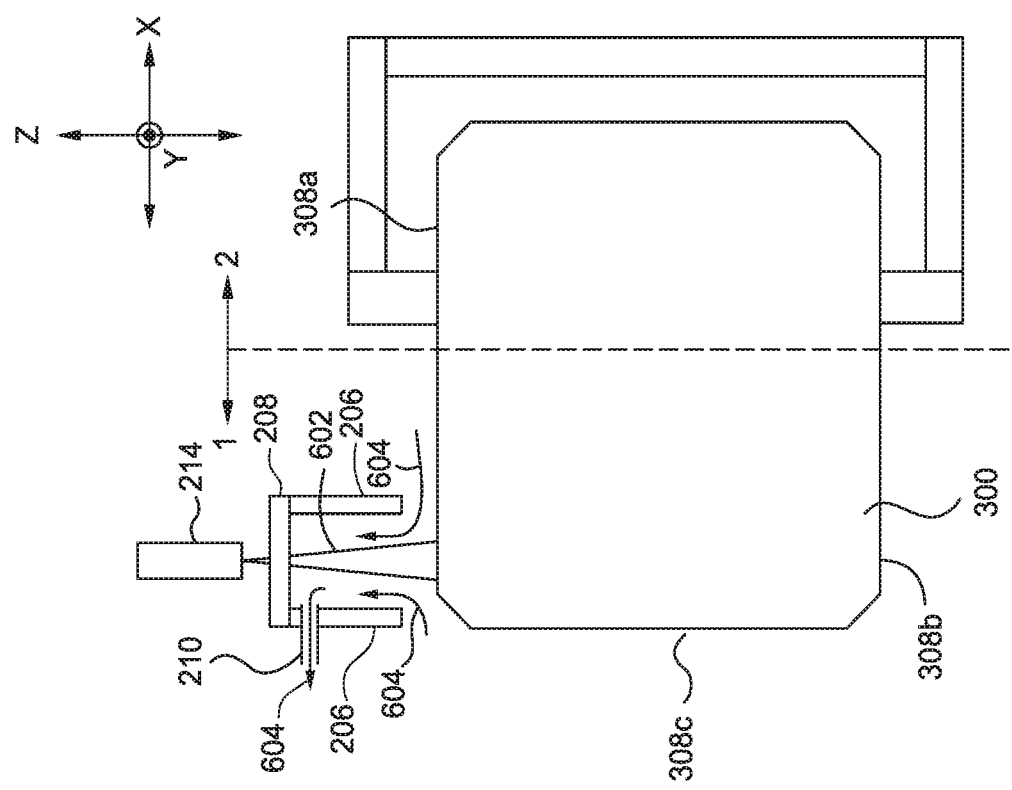
FIG. 7 is a schematic view of an orientation of a substrate during exposure of a photoresist on an edge surface of the substrate according to some examples of the present disclosure.

In operation 408, a portion of the photoresist on the edge surfaces 308a, 308b, 308c, 308d (e.g., edge surfaces 308a-1, 308b-1, 308c) of the substrate 300 is exposed to radiation from the radiation generator 214. Referring to FIG. 7, with the substrate holder 120 securing the substrate 300 via the edge surfaces 308a-2 and 308b-2, the substrate handler 100 orients the edge surface 308a in a plane perpendicular to a direction of propagation of radiation generated by the radiation generator 214. The substrate handler 100 then positions the substrate 300 such that the radiation 602 (e.g., a UV laser or e-beam) generated by and propagating from the radiation generator 214 is incident on the photoresist 304 on the edge surface 308a-1.

In some examples, the direction of propagation of the radiation 602 is fixed. In such examples, the substrate handler 100 is operable to translate the substrate 300 in an x-direction, as illustrated, to scan the radiation 602 on the photoresist 304 edge surface 308a-1. For example, from an initial position where the radiation 602 is incident on the photoresist 304 on the edge surface 308a-1, the first moveable stage 106 and/or second moveable stage 108 move in an x-direction to thereby cause the substrate 300 to be translated in the x-direction. In some examples, the direction of propagation of the radiation 602 may be moveable along a direction. In such examples, the substrate handler 100 is operable to position the substrate 300 such that the edge surface 308a-1 is aligned with the direction of movement of the direction of propagation of the radiation 602. Then, with the substrate handler 100 and substrate 300 immobile, the radiation 602 scans along the direction, e.g., the x-direction as illustrated, to be incident on the photoresist 304 on the edge surface 308a-1. In further examples, both the direction of propagation of the radiation 602 and the substrate handler 100 can be moved while exposing the photoresist 304 on the edge surface 308a-1.

After exposing the photoresist 304 on the edge surface 308a-1, the substrate handler 100 orients the edge surface 308b in a plane perpendicular to a direction of propagation of radiation generated by the radiation generator 214 and positions the substrate 300 such that the radiation is incident on the photoresist 304 on the edge surface 308b-1. For example, the substrate handler 100 rotates the substrate 300 around the x-axis, e.g., by rotating the wrist of the substrate handler 100. The photoresist 304 on the edge surface 308b-1 can then be exposed like described above with respect to the photoresist 304 on the edge surface 308a-1.

Figure 8:
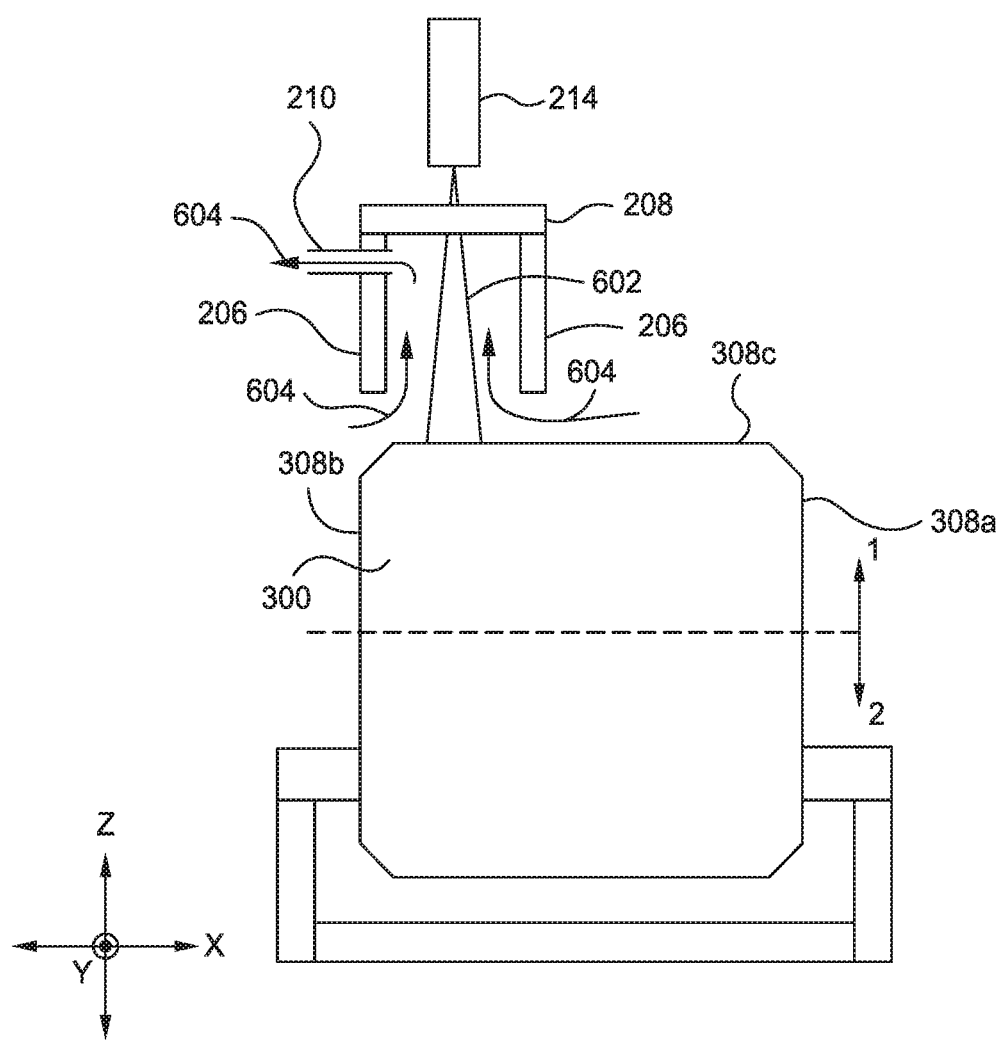
FIG. 8 is a schematic view of an orientation of a substrate during exposure of a photoresist on another edge surface of the substrate according to some examples of the present disclosure.

After exposing the photoresist on the edge surface 308b-1, referring to FIG. 8, the substrate handler 100 orients the edge surface 308c in a plane perpendicular to a direction of propagation of radiation generated by the radiation generator 214 and positions the substrate 300 such that the radiation is incident on the photoresist 304 on the edge surface 308c. For example, the substrate handler 100 rotates the substrate 300 around the y-axis, e.g., by rotating various joints and/or wrist of the substrate handler 100. The photoresist 304 on the edge surface 308c can then be exposed like described above with respect to the photoresist 304 on the edge surface 308a-1.

During exposure of the photoresist 304 on the edge surfaces 308a-1, 308b-1, and 308c, the extractor housing may be implemented or omitted as described above with respect to the exposure of the photoresist 304 on the periphery region 306-1.

In operation 410, the substrate handler 100 places the substrate 300 on the substrate stage 202 and releases the substrate 300. The substrate 300 can be placed on the substrate stage 202 similar to what is illustrated in FIG. 5. The substrate handler 100 can release the substrate 300 by actuating the jaws 122 to release the opposing forces on the edge surfaces 308a-2 and 308b-2 of the substrate 300.

Then, operations 404 through 410 are repeated. With reference to operation 404, the substrate handler 100 moves the substrate holder 120 to the substrate 300 and secures the substrate 300 by the substrate holder 120. The substrate handler 100 moves the substrate holder 120 from the side of the substrate 300 that the substrate holder 120 previously grasped to an opposite side of the substrate 300. With the substrate holder 120 positioned at the substrate 300, the jaws 122 are actuated to provide opposing force on the edge surfaces 308a-1 and 308b-1 of the substrate 300 to thereby secure the substrate 300. In other examples, the substrate stage 202 may rotate such that, without significant movement, the substrate holder 120 is positioned at edge surfaces 308a-1 and 308b-1 to secure the substrate 300.

In operation 406, a portion of photoresist 304 on the periphery region 306-2 of the deposit surface 302 of the substrate 300 is exposed to radiation from the radiation generator 214 like the portion of the periphery region 306-1 was previously exposed. In operation 408, a portion of photoresist 304 on the edge surfaces 308a, 308b, 308c, 308d (e.g., edge surfaces 308a-2, 308b-2, 308d) of the substrate 300 is exposed to radiation from the radiation generator 214 like the portion of the edge surfaces 308a, 308b, 308c, 308d (e.g., edge surfaces 308a-1, 308b-1, 308c) was previously exposed. In operation 410, the substrate handler 100 places the substrate 300 on the substrate stage 202 and releases the substrate 300. The substrate 300 can then be removed from the chamber 200 for subsequent processing.

Although the foregoing method 400 was described as exposing distinct portions by different operations, some overlap of exposures by various operations may occur. For example, during the exposure of periphery region 306-1, some of periphery region 306-2 may also be exposed, and vice versa. Also, the various sequences of exposures are described above merely as an example, and any sequence of exposures may be implemented.

Figure 9:
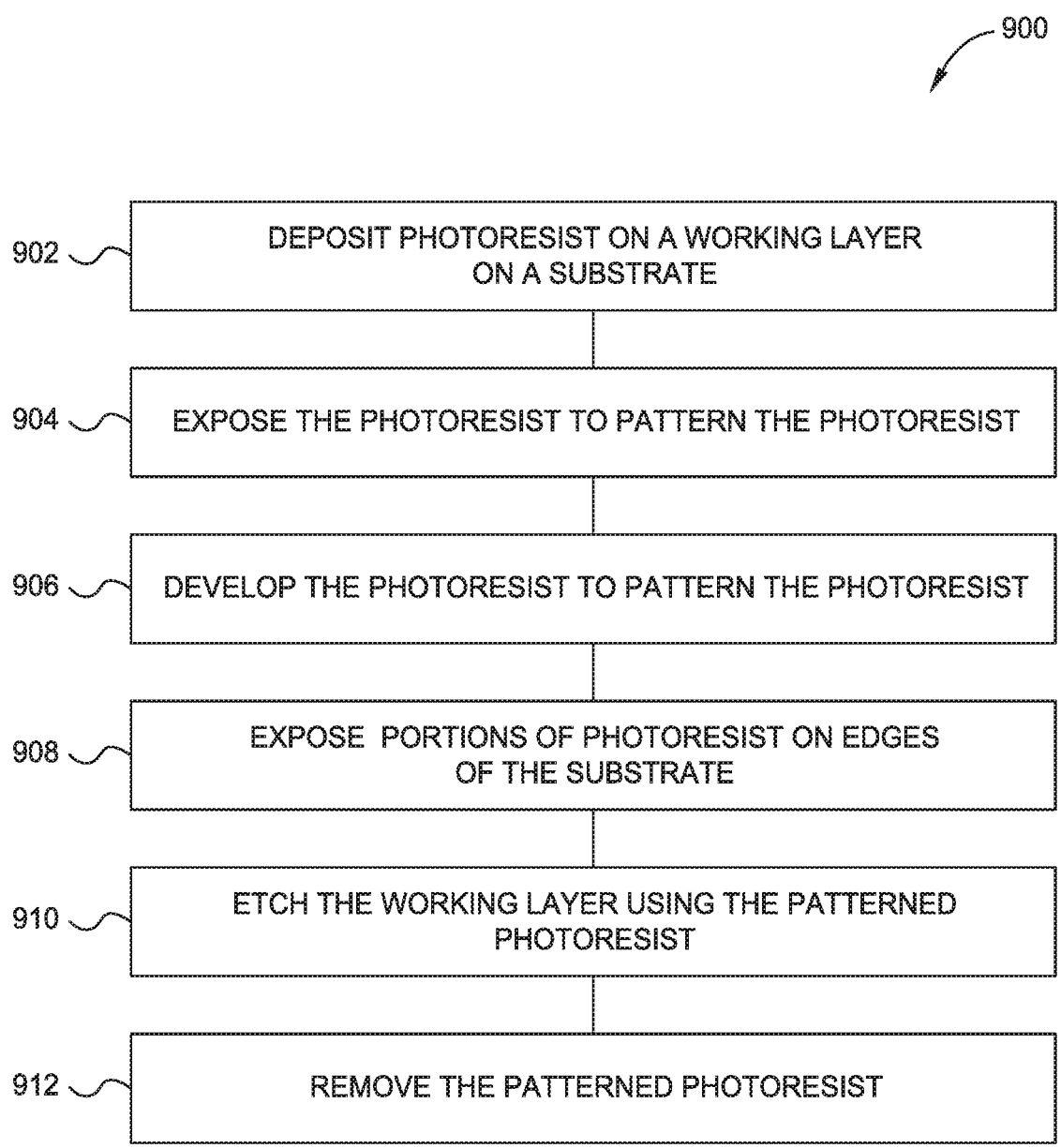
FIG. 9 is a method for processing a substrate according to some examples of the present disclosure.

FIG. 9 is a method 900 for processing a substrate according to some examples of the present disclosure. In operation 902, a photoresist is deposited on a working layer on a substrate. The working layer can be any layer to be etched. For example, for a photomask, the working layer can be an absorber layer. The photoresist can be deposited by spin coating or other deposition technique. In operation 904, the photoresist is exposed to electromagnetic radiation (e.g., light) to pattern the photoresist, and in operation 906, the photoresist is developed to pattern the photoresist. In operation 908, portions of the photoresist on edges of the substrate are exposed to radiation, such as described above with respect to the method 400 of FIG. 4. Exposing the portions of the photoresist in operation 908 ablates the exposed portions to remove the exposed portions. In operation 910, the working layer is etched using the patterned photoresist. The etching can be a dry, anisotropic process, such as a reactive ion etching (RIE), or other etch process. The removal of the portions of the photoresist on edges of the substrate removes at least some sources of contamination, which can improve replicating the pattern by the etch process in the working layer. In operation 912, the patterned photoresist is removed, such as by a wet stripping or ashing.

Figure 10:
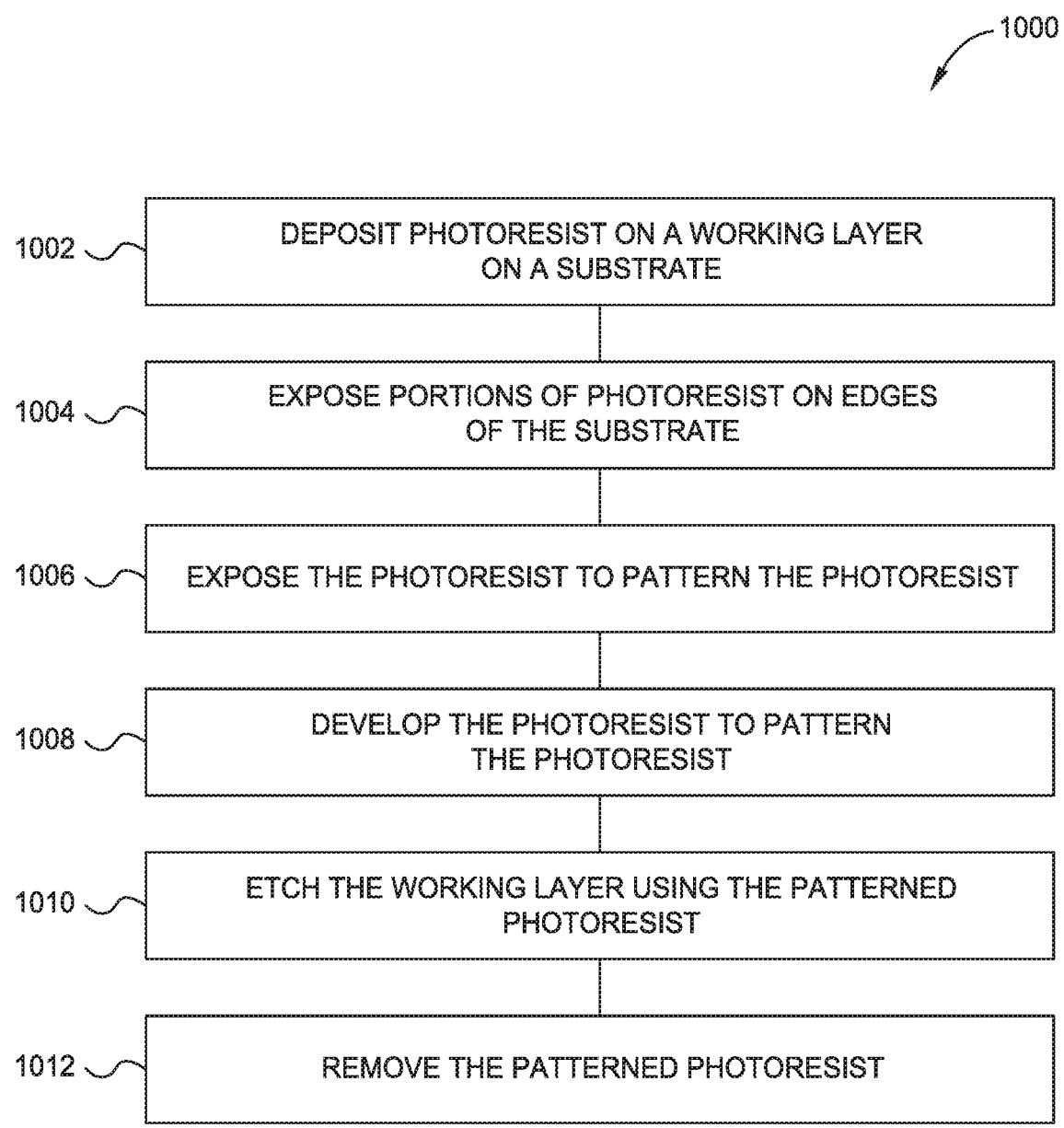
FIG. 10 is another method for processing a substrate according to some examples of the present disclosure.

FIG. 10 is a method 1000 for processing a substrate according to some examples of the present disclosure. In operation 1002, a photoresist is deposited on a working layer on a substrate. The working layer can be any layer to be etched. For example, for a photomask, the working layer can be an absorber layer. The photoresist can be deposited by spin coating or other deposition technique. In operation 1004, portions of the photoresist on edges of the substrate are exposed to radiation, such as described above with respect to the method 400 of FIG. 4. Exposing the portions of the photoresist in operation 1004 may or may not remove the exposed portions, but may make the photoresist soluble to a developer, such as when the photoresist is a positive photoresist. In operation 1006, the photoresist is exposed to electromagnetic radiation (e.g., light) to pattern the photoresist, and in operation 1008, the photoresist is developed to pattern the photoresist. Developing the photoresist in operation 1008 can remove the portions of the photoresist on the edges of the substrate that were exposed in operation 1004. In operation 1010, the working layer is etched using the patterned photoresist. The etching can be a dry, anisotropic process, such as a RIE, or other etch process. The removal of the portions of the photoresist on edges of the substrate removes at least some sources of contamination, which can improve replicating the pattern by the etch process in the working layer. In operation 1012, the patterned photoresist is removed, such as by a wet stripping or ashing.

Figure 11:
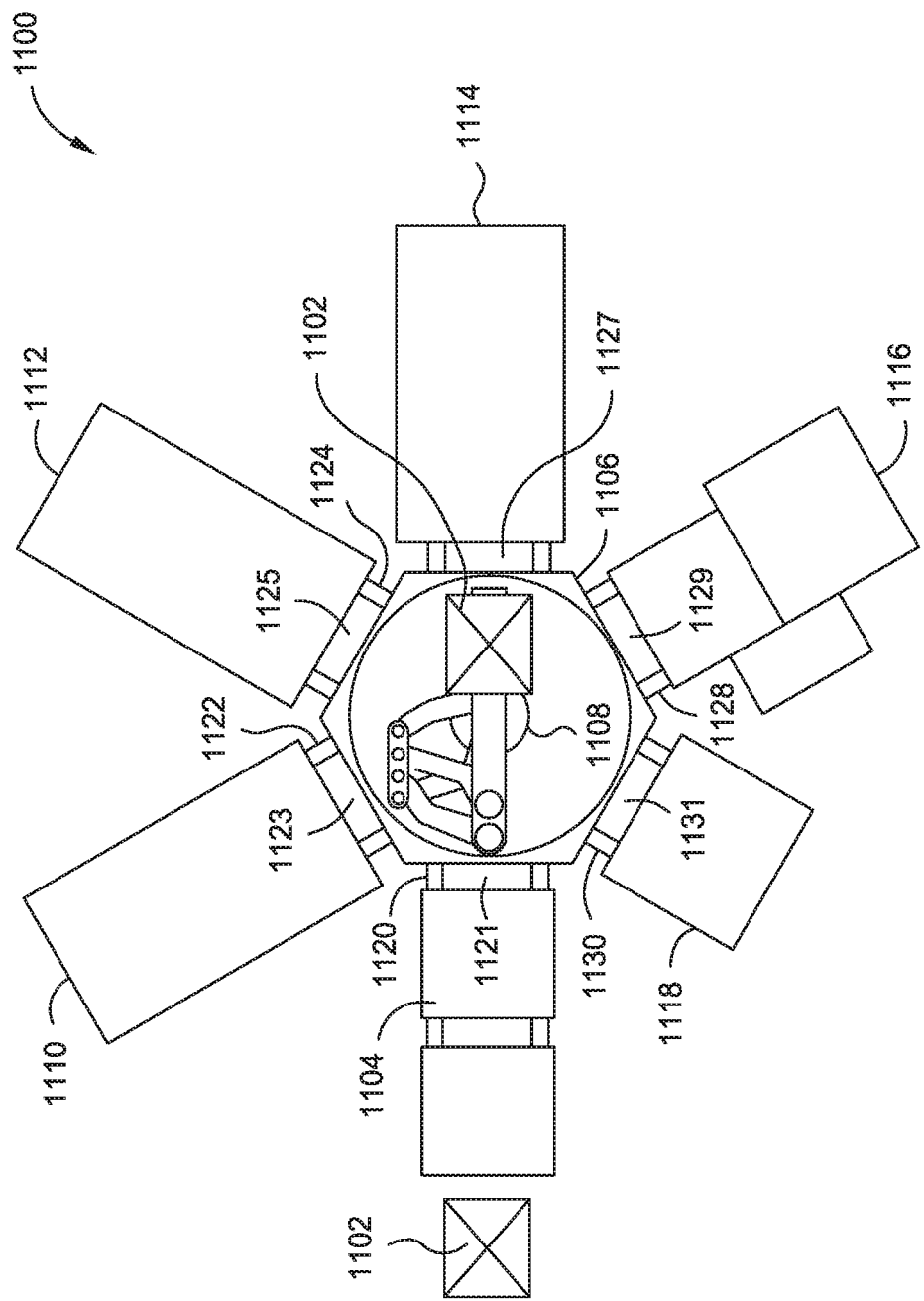
FIG. 11 is a top view of an example processing system according to some examples of the present disclosure.

FIG. 11 is a top view showing an illustrative processing system 1100 according to some examples of the present disclosure. Example substrates 1102 are shown near and within the processing system 1100. The processing system 1100 includes a load lock chamber 1104, a transfer chamber 1106, a transfer (e.g., tool and material handling) robot 1108 within the transfer chamber 1106, and processing chambers 1110, 1112, 1114, 1116, 1118. At least one of the processing chambers 1110, 1112, 1114, 1116, 1118 is the chamber 200 illustrated in FIG. 2. Others of the processing chambers 1110, 1112, 1114, 1116, 1118 each may be any appropriate processing chamber, such as for a deposition process (e.g., photoresist spin coating, atomic layer deposition (ALD), physical vapor deposition (PVD), etc.), an etch process (e.g., reactive ion etch (RIE), remote plasma treatment, etc.), a cleaning process, or the like. The processing chambers 1110, 1112, 1114, 1116, 1118 may be round, rectangular, or another shape, as may be required by the shape of the substrate to be processed and other processing requirements.

The transfer chamber 1106 includes slit valve openings 1121, 1123, 1125, 1127, 1129, 1131 in sidewalls adjacent to the load lock chamber 1104 and processing chambers 1110, 1112, 1114, 1116, 1118. The transfer robot 1108 is positioned and configured to be capable of inserting one or more tools (e.g., substrate handling blades) through each of the slit valve openings 1121, 1123, 1125, 1127, 1129, 1131 and into the adjacent chamber. That is, the transfer robot can insert tools into the load lock chamber 1104 and the processing chambers 1110, 1112, 1114, 1116, 1118 via slit valve openings 1121, 1123, 1125, 1127, 1129, 1131 in the walls of the transfer chamber 1106 adjacent to each of the other chambers. The slit valve openings 1121, 1123, 1125, 1127, 1129, 1131 are selectively opened and closed with slit valves 1120, 1122, 1124, 1126, 1128, 1130 to allow access to the interiors of the adjacent chambers when a substrate, mask, tool, or other item is to be inserted or removed from one of the adjacent chambers. A respective slit valve 1120, 1122, 1124, 1126, 1128, or 1130 can correspond to the chamber door 204 of the processing chamber 1110, 1112, 1114, 1116, or 1118 that is the chamber 200.

The transfer chamber 1106, load lock chamber 1104, and processing chambers 1110, 1112, 1114, 1116, 1118 include one or more apertures (not shown) that are in fluid communication with a vacuum system (e.g., a vacuum pump). The apertures provide an egress for the gases within the various chambers. In some examples, the chambers are each connected to a separate and independent vacuum system. In still other examples, some of the chambers share a vacuum system, while the other chambers have separate and independent vacuum systems. The vacuum systems can include vacuum pumps (not shown) and throttle valves (not shown) to regulate flows of gases through the various chambers.

The processing system 1100 includes one or more process controllers (not shown), each of which may be or include a computer or system of computers. Each process controller can include a processor that executes program code instructions stored on a tangible, non-transitory medium, such as random access memory (RAM), read-only memory (ROM), etc., to perform and/or control various operations described herein. The process controller (or a respective process controller) can control operations of the load lock chamber 1104. The process controller (or another respective process controller) can control operations of the transfer chamber 1106, such as operations of the transfer robot 1108, opening and closing of slit valves 1120, 1122, 1124, 1126, 1128, 1130, etc. The process controller (or other respective process controllers) can control operations of the processing chambers 1110, 1112, 1114, 1116, 1118 to implement various processing conditions according to a respective recipe. For example, the process controller can control operations of the exposure apparatus and substrate handler 100, such as described herein. If multiple process controllers are implemented, the process controllers may each be in communication with one or more of the other process controllers to coordinate various operations.

As illustrated, the processing system 1100 includes five processing chambers and one load lock. In other examples, a processing system can include any number of processing chambers and load locks. For example, a processing system can include four processing chambers and two load locks. Other numbers of processing chambers and load locks can be implemented.

In still further examples, a processing system can implement the chamber 200 with a load lock or other fabrication facility interface as a standalone processing system without other processing chambers. A person having ordinary skill in the art will readily understand such a processing system in view of the foregoing description.

While the foregoing is directed to various examples of the present disclosure, other and further examples may be devised without departing from the basic scope thereof, and the scope thereof is determined by the claims that follow.

The invention claimed is:
1. A processing system comprising:
a chamber;
a substrate handler within the chamber, the substrate handler being configured to secure a substrate; and
a radiation generator within the chamber, the substrate handler further being operable to position an edge surface of the substrate such that radiation propagating from the radiation generator is directed to the edge surface of the substrate, and operable to position a periphery region of a deposit surface of the substrate that is perpendicular to and along the edge surface such that radiation propagating from the radiation generator is directed to the periphery region of the deposit surface.

2. The processing system of claim 1 further comprising an extractor housing comprising:
sidewalls defining an interior space and an opening, the interior space being fluidly coupled to an outlet; and
a transparent window disposed on the sidewalls opposite from the opening, the radiation generator being positioned to direct radiation through the transparent window, the interior space, and the opening.

3. The processing system of claim 1, wherein the substrate handler includes a first moveable stage and a second moveable stage, the first moveable stage being laterally moveable along a first direction, the second moveable stage being laterally moveable along a second direction perpendicular to the first direction.

4. The processing system of claim 1, wherein the substrate handler includes:
a rotatable stage;
a first rotatable joint supported by the rotatable stage;
a first link attached to the first rotatable joint;
a second rotatable joint attached to the first link;
a second link attached to the second rotatable joint;
a wrist attached to the second link; and a clamp attached to the wrist, the clamp being configured to use opposing forces at opposing edge surfaces of the substrate to secure the substrate.

5. The processing system of claim 1, wherein the substrate handler is operable to position, at different times, each edge surface of the substrate such that radiation propagating from the radiation generator is directed to the respective edge surface of the substrate, and operable to position, at different times, the periphery region that is perpendicular to and along each edge surface such that radiation propagating from the radiation generator is directed to the periphery region of the deposit surface.

6. The processing system of claim 1, wherein the radiation generator is an ultraviolet (UV) laser generator.

7. The processing system of claim 1, wherein the radiation generator is an electron beam (e-beam) generator.

8. A method of processing a substrate, the method comprising:
  positioning, in a first orientation, a periphery region of a deposit surface of the substrate relative to a radiation generator to have radiation from the radiation generator be directed to the periphery region, the deposit surface having a layer deposited thereon;
  directing radiation from the radiation generator to the periphery region while the periphery region is in the first orientation;
  positioning, in a second orientation, an edge surface of the substrate relative to the radiation generator to have radiation from the radiation generator be directed to the edge surface, the edge surface being perpendicular to the deposit surface; and
  directing radiation from the radiation generator to the edge surface while the edge surface is in the second orientation.

9. The method of claim 8, wherein directing radiation to the periphery region and to the edge surface ablates a portion of the layer on the periphery region and the edge surface.

10. The method of claim 8, wherein the layer is a positive photoresist, and the method further includes, after directing radiation to the periphery region and the edge surface, developing the positive photoresist.

11. The method of claim 8, wherein the substrate is a photomask.

12. The method of claim 8, wherein:
  directing radiation to the periphery region while the periphery region is in the first orientation includes translating the substrate in the first orientation, wherein while translating the substrate in the first orientation, the radiation scans along the periphery region; and
  directing radiation to the edge surface while the edge surface is in the second orientation includes translating the substrate in the second orientation, wherein while translating the substrate in the second orientation, the radiation scans along the edge surface.

13. The method of claim 8, wherein:
  directing radiation to the periphery region while the periphery region is in the first orientation includes moving a direction of propagation of the radiation to scan along the periphery region while the substrate is immobile; and
  directing radiation to the edge surface while the edge surface is in the second orientation includes moving a direction of propagation of the radiation to scan along the edge surface while the substrate is immobile.

14. The method of claim 8, wherein:
  positioning, in the first orientation, the periphery region relative to the radiation generator includes positioning the periphery region proximate an opening of an extractor housing;
  directing radiation to the periphery region includes:
    directing radiation through a transparent window of the extractor housing to the periphery region; and
    exhausting a gas from the extractor housing; and
  positioning, in the second orientation, the edge surface relative to the radiation generator includes positioning the edge surface proximate the opening of the extractor housing;
  directing radiation to the edge surface includes:
    directing radiation through the transparent window of the extractor housing to the edge surface; and
    exhausting a gas from the extractor housing.

15. The method of claim 8, wherein directing radiation to the periphery region and the edge surface comprises directing an ultraviolet (UV) laser or electron beam (e-beam) at the periphery region and the edge surface.

16. A method of processing a substrate, the method comprising:
  depositing a photoresist on a working layer on a rectangular substrate;
  patterning the photoresist;
  exposing portions of the photoresist on perpendicular surfaces at an edge of the rectangular substrate to radiation; and
  after exposing the portions of the photoresist to radiation, etching the working layer including using the patterned photoresist as a mask.

17. The method of claim 16, wherein exposing the portions of the photoresist to the radiation ablates the portions of the photoresist.

18. The method of claim 16, wherein patterning the photoresist includes developing the photoresist after exposing the portions of the photoresist to the radiation, developing the photoresist includes removing the portions of the photoresist exposed to the radiation.

19. The method of claim 16 further comprising exhausting a gas from proximate the rectangular substrate while exposing the portions of the photoresist to the radiation.

20. The method of claim 16, wherein the radiation includes an ultraviolet (UV) laser or an electron beam (e-beam).

* * * * *